United States Patent [19]

Case et al.

[11] Patent Number: 4,583,044
[45] Date of Patent: Apr. 15, 1986

[54] NMR IMAGING METHOD

[75] Inventors: Thomas A. Case; Duane D. Blatter; David C. Ailion, all of Salt Lake City, Utah

[73] Assignee: University of Utah, Salt Lake City, Utah

[21] Appl. No.: 569,510

[22] Filed: Jan. 9, 1984

[51] Int. Cl.$^4$ .................................. G01R 33/20
[52] U.S. Cl. .................................. 324/309; 324/312
[58] Field of Search .............. 324/300, 307, 309, 312, 324/313; 364/414, 415; 128/653

[56] References Cited

U.S. PATENT DOCUMENTS

| | | | |
|---|---|---|---|
| 4,290,019 | 9/1981 | Hutchison | 324/309 |
| 4,318,043 | 3/1982 | Crooks | 324/309 |
| 4,516,075 | 5/1985 | Moran | 324/309 |

Primary Examiner—Michael J. Tokar
Attorney, Agent, or Firm—Trask & Britt

[57] ABSTRACT

NMR images are resolved from FID signal data generated under asymmetric conditions. Subtraction NMR images are resolved from corresponding signal data generated under both symmetric and asymmetric conditions.

17 Claims, 10 Drawing Figures

NMR IMAGING METHOD

BACKGROUND OF THE INVENTION

1. Field:

This invention relates to NMR imaging techniques and is particularly directed to such a technique adapted to display an image revealing the presence of tissues, such as fat, or aerated lung tissue, characterized by internal magnetic inhomogeneities.

2. State of the Art:

Nuclear magnetic resonance (NMR) has been recognized as a useful phenomenon in various physical and chemical fields. A variety of NMR-based analytical techniques have evolved in disparate physical and chemical disciplines, including medical-related sciences, notably biophysics and biochemistry. Among these techniques is the measurement of water content (or mobile proton content) in various organic substances, including tissues. Available NMR apparatus is capable of producing complicated pulse sequences, automatically recording the NMR signals resulting from applying those pulse sequences to a target and then processing those signals "on line" to produce an image.

The state of the art of NMR imaging in biomedicine is reflected in the book "NMR Imaging in Biomedicine", P. Mansfield and P. G. Morris, 1982 Academic Press, New York, N.Y. (Library of Congress Catolog Card No. 65-26774). The disclosure of that text book is incorporated herein by reference.

The method of NMR imaging which forms the background for this invention involves placing a specimen containing a selected nuclear species within an approximately homogeneous magnetic field "$H_O$" to effect a net nuclear magnetization of that nuclear species. The nuclear species selected for biomedical NMR applications is ordinarily water, but other species such as phosphorous, fluorine and sodium may be selected. For other NMR applications, a nuclear species may be selected from any of a hundred or more substances which are known to have nonintegral spins. The nuclei of the selected nuclear species are irradiated within a target region of the specimen during a "90° pulse" with a radio frequency varying magnetic field to orient the net nuclear magnetization of the selected species within the target region to a direction approximately normal to the homogeneous magnetic field.

The term "90° pulse" is used herein in the sense it is conventionally used in NMR technology to indicate the intensity and duration of a pulse of energy applied to the nuclei to effect a maximum NMR decay signal [usually called a free induction decay (FID) signal]. The duration for which the 90° pulse is applied is referred to herein as a "90° pulse duration." Following the application of the 90° pulse, a first magnetic gradient is applied to the homogeneous field to effect a first spatially varying resultant field. The net nuclear magnetization is permitted to precess about this first resultant field during a first free induction decay (FID) interval, thereby to induce a first NMR signal voltage across a receiver device. The receiver device is usually a tuned pickup, such as a tuned rf receiving coil, but it may be embodied as some other pickup or antenna device. The first magnetic gradient is terminated after the first NMR signal has decayed. The nuclei are then irradiated within the target region by a 180° pulse during a "180° pulse duration" with a radio frequency varying magnetic field to cause them to rephase during a second FID interval. The term "180° pulse" is used herein in the sense it is conventionally used in NMR terminology to mean the intensity and duration of a pulse of energy applied to the nuclei to effect a rotation of all spins by 180° about an axis perpendicular to the homogeneous magnetic field ($H_O$). The duration that this pulse is applied is called a "180° pulse duration." A second magnetic gradient is applied to the homogeneous magnetic field during the second FID interval to effect a second spatially varying resultant field. During this time, a second NMR signal voltage is ordinarily present across the receiver device. The first and second NMR signals are ordinarily ignored, but a resultant NMR echo signal, which occurs subsequently, is detected and processed in various ways.

Ordinarily, a large number of echo signals are induced from various target regions within the specimen, and the signals are resolved into NMR images of varying types. Typically, a sequence of individual procedures ("experiments") is performed. Each experiment generates an NMR echo signal. Field gradients are imposed upon the homogeneous magnetic field, and those field gradients are systematically adjusted to a plurality of net field conditions, each of which is maintained for a discrete interval of time corresponding to an individual experiment. The foregoing sequence of steps is repeated during each of the net field conditions in accordance with an NMR imaging strategy to produce a corresponding plurality of echo NMR signals, each of which emanates from a discrete target region within the specimen. The various imaging strategies available may result in echo signals which can be resolved into zero, one, two, three or multidimensional images. The electronic and logic circuitry utilized in connection with modern CAT scanning techniques are commonly utilized to process NMR echo signal data. In this fashion, NMR signal data are resolved to produce NMR images analogous to conventional CAT scanning images. Other general or specialized logic circuitry may be used in place of or to supplement conventional CAT scanning logic circuitry. There are currently available commercial NMR scanners which include logic circuits specifically adapted to NMR imaging.

It is known to apply NMR imaging techniques to the study of various systems, including biological and chemical systems. The basic approach to producing images in these systems is generally similar.

SUMMARY OF THE INVENTION

The present invention provides a new method of NMR imaging which provides high contrast images of substances which contain a nuclear species subjected to gradients (magnetic inhomogeneities) inherent to the substance. Although the method described herein may find application in many fields, it is described with particular reference to the imaging of aerated lung and fatty tissues. For purposes of illustration only, hydrogen is regarded as the selected nuclear species. The method is based upon the observation that FID time ($T_2^*$) in NMR imaging of certain tissues (notably aerated lung and fat tissue) is shortened by either an internal inhomogeneous broadening mechanism or a mechanism which results in a series of closely spaced NMR lines that are simultaneously irradiated by the excitation pulse. That mechanism is postulated to be caused by the presence of inhomogeneities in internal magnetic fields within the tissue. In the case of lung tissue, this inhomogeneity is apparently due to different diamagnetic shifts experienced by water molecules at different distances from the lung surface, where there occurs an air-water interface. Because the diamagnetism of the tissue is inhomogeneous as a consequence of the interface, the protons within a resolvable region precess with different frequencies. Water molecules near an air space within the lung tissue will of necessity experience a higher field than those deeper into the tissue. The claimed technique makes it possible to observe a spin-echo in which only the signal lost from external gradients is refocused. That is, an image may be resolved from the NMR echo signal data obtained by the claimed method which includes little or no data attributable to the water molecules experiencing sample-induced magnetic field inhomogeneities.

The new images provided by this invention are produced by generating NMR signal data under conditions which are referred to herein as "asymmetric" conditions. Conventional NMR imaging conditions are referred to herein as "symmetric" conditions. The claimed method also contemplates generating NMR echo signal data from a common target area under both symmetric and asymmetric conditions. This data may then be processed to resolve a subtraction image to reveal the density of nuclei of the species experiencing an internal magnetic inhomogeneity within the target region. It is presently preferred to resolve the NMR echo signal data obtained under symmetric and asymmetric conditions to an image corresponding to the subtraction of an asymmetric image from a symmetric image divided by the symmetric image, thereby to reveal the proportion of nuclei of the selected species (in the case of lung tissue, water) experiencing an internal magnetic inhomogeneity within the target region. These images have heretofore been unavailable in NMR imaging techniques, and are extremely useful. They provide high contrast images of selected tissues of interest, notably lung and fat.

According to this invention, a target specimen is subjected to a 90°-180° pulse sequence (a 90° pulse followed by a 180° pulse), and a spin-echo is obtained following more or less conventional procedures, except that the magnetic gradient applied during the free induction decay (FID) period following the 180° pulse interval is asymmetric with respect to time and intensity with the gradient applied following the 90° pulse interval. The resulting asymmetric NMR echo signal contains very substantially reduced signal components attributable to internal magnetic inhomogeneities inherent in the specimen.

The preferred embodiments of this invention involve producing NMR signals under both asymmetric and symmetric conditions while applying external field gradients in accordance with conventional procedures through an imaging strategy and then resolving the NMR echo signals thereby produced through appropriate computer circuits, such as those present in commercially available NMR imaging systems.

BRIEF DESCRIPTION OF THE DRAWINGS

In the drawings, which illustrate that which is presently regarded as the best mode for carrying out the invention.

DESCRIPTION OF THE ILLUSTRATED EMBODIMENT

Figure 1:
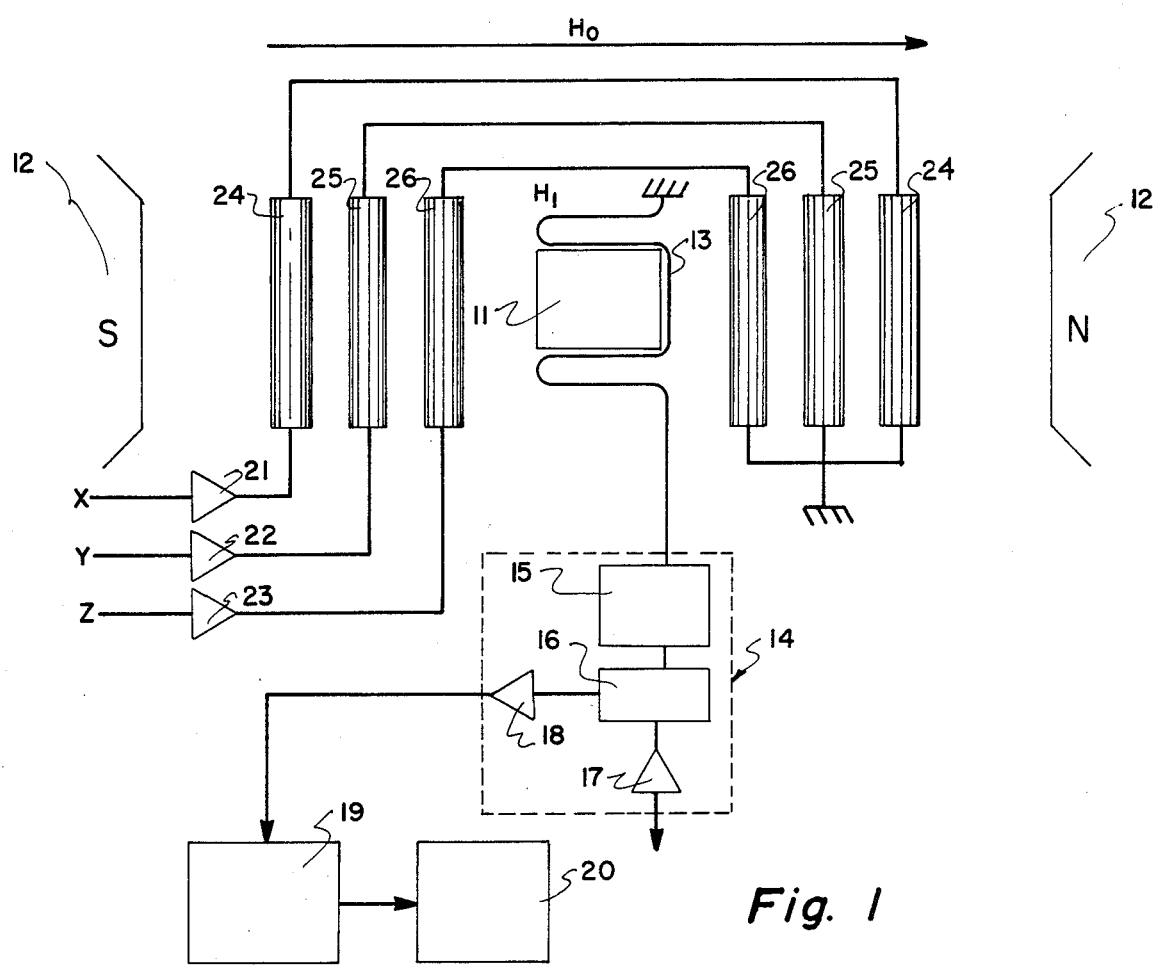
FIG. 1 is a schematic illustration of an arrangement of components useful for the practice of this invention.

Referring to FIG. 1, a specimen 11 is placed within an approximately homogeneous magnetic field $H_O$ maintained by an electromagnet 12. As illustrated, the specimen 11 is located between the poles of the magnet 12 within the windings of an rf coil 13. The coil 13 is a portion of a pulse circuit 14 which includes an rf tuned circuit 15, a coupling circuit 16, an input amplifier 17 and an output amplifier 18. Input pulses; i.e., 90° and 180° pulses, are applied to the specimen 11 through the input 17 and coil 13. The 90° pulse effects a net nuclear magnetization $H_1$. NMR signal data (FID echo data) picked up by the coil 13 following the 180° pulse are delivered through the output 18. These data are directed to processing circuitry 19 (e.g., a computer) by which they are resolved into images displayed by an appropriate auxiliary device 20. Orthogonal X, Y and Z gradients are applied selectively through inputs 21, 22, 23, respectively, of gradient coils 24, 25 and 26. All of the aforementioned components are typically present in commercially available NMR imaging systems.

Figure 2:
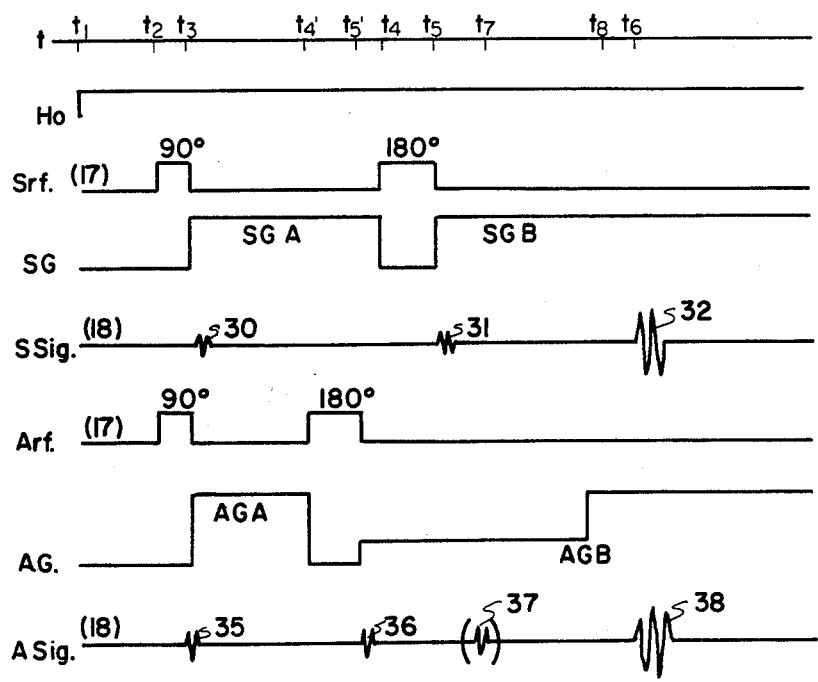
FIG. 2 is a pulse chart illustrating the sequence of significant pulses and signals characteristic of this invention.

FIG. 2 correlates various control parameters and generated signals with a typical procedure of this invention whereby the apparatus illustrated by FIG. 1 is operated to produce the images of FIGS. 3 through 10. FIG. 2 is actually a compressed illustration comparing two experiments conducted with reference to a single target region within a specimen 11. The target region is fixed by proper orientation of the specimen 11 within the coils 12 and 13 and by controlling the X, Y and Z gradients applied by the coils 24, 25, 26. The illustrated sequences produce correlated paired data under both symmetric and asymmetric conditions for the selected target region only. The images illustrated by FIGS. 3 through 10 are resolved from a large number of such paired data taken from a corresponding large number of target regions.

Referring to FIG. 2, at time $t_1$, the specimen 11 is positioned, as shown by FIG. 1, within the magnetic field $H_O$. Considering first the experiment under symmetric conditions, a 90° radio frequency pulse (Srf) is initiated at input 17 at a time $t_2$. This pulse is maintained for a duration until time $t_3$, at which time it is turned off, and a first magnetic gradient (SG) SGA is applied (e.g., by means of coil 26) until a time $t_4$. During the interval between $t_3$ and $t_4$, a first free induction decay occurs, as reflected by a first NMR signal 30 (symmetric signal, S Sig) which appears at output 18. At time $t_4$, the gradient SGA is turned off and a 180° pulse (Srf) is applied. The 180° pulse duration is terminated at time $t_5$ and a second gradient (SG) SGB is applied. A second NMR signal 31 (symmetric signal, S Sig) occurs during the application of gradient SGB after time $t_5$, and at time $t_6$ a symmetric echo NMR signal 32 is detected at output 18. Because the gradient SGB is of the same intensity as the gradient SGA, the symmetric echo NMR signal occurs at a time interval following the 180° pulse which is approximately equal to the time interval between the initiation of the 180° pulse and the termination of the 90° pulse. The signal 32 includes components attributable to nuclei experiencing internal gradients because such gradients are essentially constant during the experiment. (That is, the internal gradients may be regarded as symmetric.) As a consequence, the transverse rephasing resulting from internal inhomogeneities is substantially completely refocused.

The lines labeled "Arf," "AG" and "A Sig" in FIG. 2 illustrate the asymmetric procedure by which an echo NMR signal may be obtained which includes very much reduced components attributable to nuclei experiencing internal gradients. The times referred to in the following explanation of an asymmetric procedure are not identical to those referred to in the previous explanation of a symmetric procedure, but they bear a similar relationship to each other. Thus, at time $t_1$, the specimen is exposed to the field $H_O$. A 90° pulse (Arf) is applied during the interval between times $t_2$ and $t_3$, at which time a first gradient (AG) AGA is applied. A first FID NMR signal (A Sig) 35 occurs as in the case of the experiment conducted under symmetric conditions. The gradient AGA is of greater intensity and shorter duration than the gradient SGA so that the 180° pulse (Arf) is applied at a time $t_4'$ which occurs a shorter time interval after $t_1$ than does the time $t_4$. Accordingly, the second gradient AGB is initiated at a time $t_5'$ which occurs relatively sooner than does the time $t_5$. The second FID NMR signal 36 occurs during the application of this gradient AGB. If an echo signal 37 attributable to the nuclei experiencing internal gradients were to occur, it would do so at the symmetric (with respect to time) location, $t_7$ because those internal gradients are again uninfluenced by changing the external magnetic gradients. Accordingly, the transverse dephasing induced by the internal gradients is refocused only at the symmetric time $t_7$.

The echo signal 38 attributable to nuclei experiencing the externally applied gradient AGB (and excluding most of the signal components attributable to internal magnetic inhomogeneities) occurs at the time that the total radians per centimeter of dephasing (gauss/cm-×time) of the gradient AGB equals the total radians per centimeter of dephasing of the gradient AGA. The occurrence of this event is determined by the intensity of the gradient applied. As illustrated, the gradient AGB is applied at a first relatively low intensity commencing at time $t_5'$ until a time $t_8$ shortly prior to time $t_6$, at which time its intensity is increased to match that of the second symmetric gradient (SG) SGB. Thus, the occurrence time of the asymmetric 180° pulse and the intensity of the asymmetric gradient AGB are adjusted as appropriate to assure the occurrence of the asymmetric NMR echo signal 38 at time $t_6$ relatively identical (with respect to initiation of the 90° pulse, $t_2$) to the occurrence of the symmetric NMR echo signal 32. By this means, the effects of transverse decay ($T_2$) are identical for both signals. Moreover, by maintaining the intensity of the gradients AGB at time $t_6$ identical to that of the gradient SGB at its respective time $t_6$, the external gradients inherent to the signals 32 and 38 are approximately identical. Accordingly, these signals can be processed without correcting for $T_2$ or gradient effects. That is, a pixel in the symmetric image will correspond in location to the same pixel in the asymmetric image.

The sequence illustrated by FIG. 2 may be repeated hundreds or thousands of times, as needed under various gradient conditions (net field conditions) to produce a plurality of symmetric and asymmetric echo NMR signals from a corresponding plurality of target regions within the specimen. Of course, the position of the specimen may also be physically moved within the coil 13 to change the target region. In any event, the data contained in the symmetric and asymmetric echo NMR signals obtained by varying the gradient and/or position parameters in accordance with any selected imaging strategy may be processed by a computer 19 and resolved into a selected image or group of images.

Two types of subtraction images are of particular interest. Subtracting the signal 38 from the signal 32 results in a first form of a subtracted echo NMR signal attributable to nuclei of the selected species which experience an internal magnetic inhomogeneity. The data from a plurality of such subtractions can be resolved into a density subtraction image revealing the density of nuclei of a selected species within the target regions experiencing an internal magnetic inhomogeneity. The subtracted echo NMR signals may be divided in each instance by the symmetric echo signal 32 to produce a second form of a subtracted echo NMR signal. The plurality of such signals produced by an imaging strategy may be resolved into a proportioned subtraction image which reveals the proportion of nuclei of the selected species within the target regions experiencing an internal magnetic inhomogeneity.

The following examples illustrate the procedures of this invention as applied to the imaging of lung tissue and kidney tissue.

EXAMPLE I

A 12-inch Varian electromagnet was modified by the addition of orthogonal gradient coils and an rf coil according to the plan illustrated by FIG. 1. The rf coil was sized (with an opening of approximately 4 cm) to fit within the homogeneous ($\pm 0.2$ gauss) region of the electromagnet. A rat was sacrificed and placed in a 4 cm diameter clear plastic tube. The tube and rat were positioned within the rf coil by means of a fixture associated with a linear drive mechanism enabling movement of the rat through the homogeneous region. The apparatus was operated to produce 90°-180° pulse sequences under both symmetric and asymmetric conditions similar but not identical to those illustrated by FIG. 2. The specific conditions recited in this example generated pulses and gradients different in detail from those specifically shown in FIG. 2.

The symmetric conditions involved initiating a 90° pulse of 40 megaherz at time $t_2$. Two milliseconds later, at time $t_3$, the pulse was terminated and a gradient SGA of 2.5 gauss per centimeter was applied. At time $t_4$, 4.5 milliseconds after $t_3$, the gradient SGA was turned off, and a 180° 40 magaherz pulse was applied for a duration of 2 miliseconds, terminating at time $t_5$ (8.5 milliseconds following time $t_2$). At time $t_5$ the gradient SGB was applied at 2.5 gauss/cm and continued until a time 12 milliseconds following time $t_2$ at which time it was decreased in magnitude to 0.833 gauss/cm. An echo signal (32) was detected 15 milliseconds following time $t_2$.

The asymmetric conditions involved the same 90° pulse sequence, but the gradient AGA was 4.5 gauss/cm for a duration of 2.5 milliseconds. A two millisecond, 40 megaherz 180° pulse was initiated at time $t_4'$ (4.5 milliseconds following time $t_2$). The gradient AGB was applied at 1.6 gauss/cm for a duration of 5.5 milliseconds and was reduced to 0.833 gauss/cm at a time 12 milliseconds after time $t_2$. An asymmetric echo signal was detected at a time 15 milliseconds after time $t_2$.

Figure 3:
FIGS. 3, 4, 5 and 6 are illustrations of images which were resolved from NMR data generated by the practice of this invention on the thorax of a rat.
Figure 4:
Figure 5:
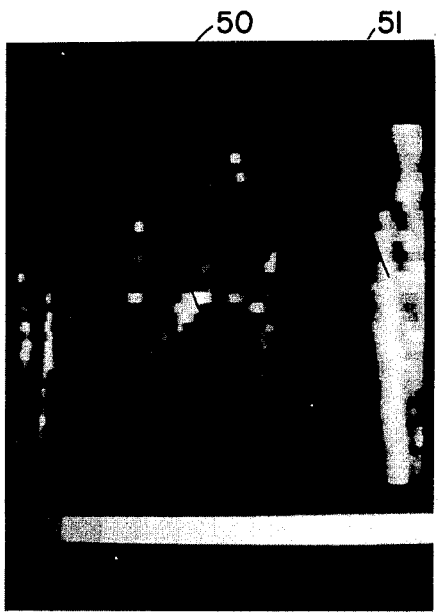
Figure 6:
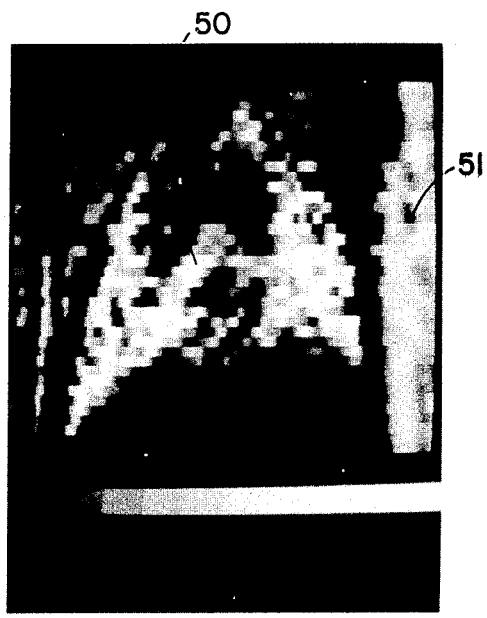
Figure 7:
FIGS. 7, 8, 9 and 10 are illustrations of images which were resolved from NMR data generated by the practice of this invention on human kidney tissue.
Figure 8:
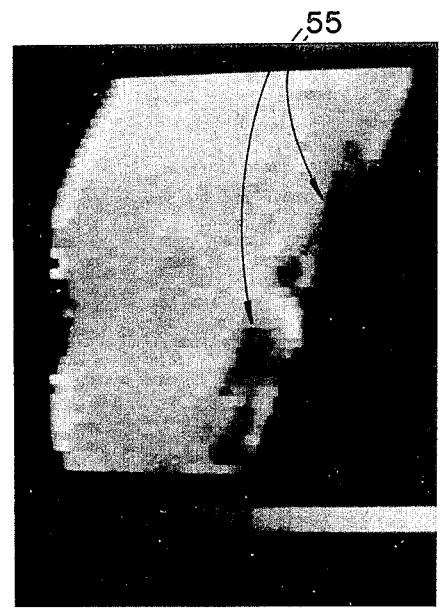
Figure 9:
Figure 10:
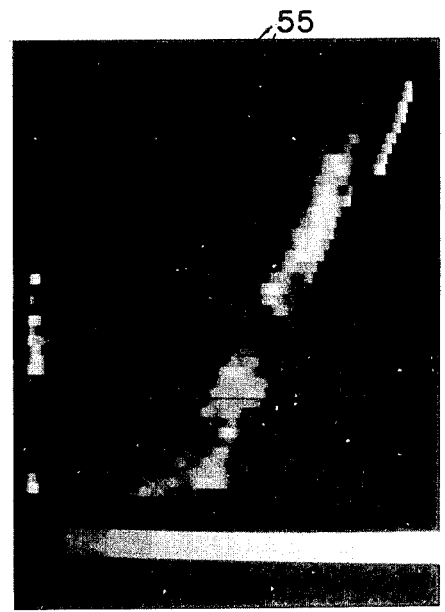

The rat was moved through the rf coil by means of the linear drive, and additional echo signals were produced under both symmetric and asymmetric conditions. Approximately 40 such paired signals were resolved by computer processing to the images shown by FIGS. 3 through 6. FIG. 3 is a symmetric image; e.g., an image produced by resolving the signal data generated under symmetric conditions. FIG. 4 is an asymmetric image; e.g., an image produced by resolving the signal data generated under asymmetric conditions. It is apparent that the asymmetric image (FIG. 4) contains information in the regions 50, 51 not visible in the symmetric image (FIG. 3). FIG. 5 is one form of subtraction image (revealing the density of water in the tissue) obtained by resolving the data obtained by subtracting the asymmetric signal data from the symmetric signal data. FIG. 6 is an alternative form of subtraction imaging (revealing the proportion of water in the tissue) obtained by dividing the subtraction data resolvable into FIG. 5 by the symmetric signal data of FIG. 3. FIGS. 4, 5 and 6 are alternative modes of displaying the information inherent from a comparison of the symmetric and asymmetric signal data produced by this example. Surgical procedures revealed that the regions 50, 51 contained fatty tissue not discernable from the symmetric NMR image of FIG. 3.

EXAMPLE II

A portion of human kidney was placed in the plastic tube described in Example I. Echo signal data were generated under symmetric and asymmetric conditions identical to those described in Example I. FIGS. 7, 8, 9 and 10 correspond in type to FIGS. 3, 4, 5 and 6, respectively. In this case, the asymmetric signal data is resolved to display in FIGS. 8, 9 and 10 fatty tissue 55 not apparent in the conventional NMR image FIG. 7. Visual inspection confirmed that the portion 55 was indeed fatty tissue.

It is contemplated that the procedure disclosed herein may be applied to image oil/water interfaces, such as may exist in oil shale and/or sand deposits. They may also be utilized to identify uncombined water in crystalline materials, such as B or B'' alumina. When the specimen is a solid state material, symmetric and asymmetric echo NMR signals may be resolved to produce an image revealing the density of non-aggregated water molecules within a target area. When the specimen is a substance containing both oil and water, symmetric and asymmetric echo NMR signals may be resolved to produce an image revealing the density of oil/water in a target area.

Reference herein to details of the illustrated embodiments is not intended to restrict the appended claims which themselves recite the limitations regarded as descriptive of the invention.

We claim:

1. In the method of NMR imaging which includes:
   placing a specimen containing a selected nuclear species within an approximately homogeneous magnetic field to effect a net nuclear magnetization of said nuclear species;
   irradiating the nuclei of said nuclear species within a target region of said specimen during a 90° pulse duration with a radio frequency varying magnetic field to orient the net nuclear magnetization of said species within said region to a direction approximately normal the homogeneous magnetic field;
   applying a first magnetic gradient to said homogeneous field to effect a first spatially varying resultant field, and permitting said net magnetization to precess about said first resultant field during a first free induction decay interval, thereby to induce a first NMR signal voltage across a receiver device;
   terminating said first gradient after said first NMR signal has decayed, and irradiating said nuclei within said target region during a 180° pulse duration with a radio frequency varying magnetic field to cause them to rephase during a second free induction decay interval;
   applying a second magnetic gradient to said homogeneous magnetic field during said second free induction decay interval to effect a second spatially varying resultant field, while permitting the individual nuclei to precess about said second resultant field, thereby to induce a second NMR signal voltage across said receiver device; and
   detecting an NMR echo signal; the improvement comprising: establishing said second magnetic gradient asymmetric with respect to said first gradient and detecting any "asymmetric" echo NMR signal occurring at a time interval following said 180° pulse duration which is different from the time interval between said 90° pulse duration and said 180° pulse duration, said asymmetric echo NMR signal containing reduced signal components attributable to internal magnetic field inhomogeneities inherent in said specimen.

2. An improvement according to claim 1 wherein a symmetric echo NMR signal is also induced from said target region by the procedures followed to induce said asymmetric echo NMR signal, except that the second gradient is symmetric with respect to said first gradient and said symmetric echo NMR signal is detected at a time following said 180° pulse duration an interval approximately equal the time duration between said 90° pulse duration and said 180° pulse duration, said symmetric echo NMR signal including signal components attributable to internal field inhomogeneities inherent in said specimen.

3. An improvement according to claim 2 wherein the gradient applied during the detection of the asymmetric echo NMR signal is of approximately the same magnitude as the gradient applied during the detection of the symmetric echo NMR signal.

4. An improvement according to claim 1 wherein field gradients are imposed upon said homogeneous magnetic field; said field gradients are systematically altered to a plurality of net field conditions which are each maintained for an interval of time; and the sequence of steps defined by claim 1 is repeated during each of said net field conditions in accordance with an NMR imaging strategy to produce a corresponding plurality of asymmetric echo NMR signals emanating from a corresponding plurality of target regions within said specimen.

5. An improvement according to claim 4 wherein said echo NMR signals are resolved to produce an asymmetric NMR image revealing the density of said nuclear species in said target regions, substantially excluding those nuclei which have experienced internal magnetic field inhomogeneities.

6. An improvement according to claim 4 wherein a symmetric echo NMR signal is also induced from each of said target regions by the procedures followed to induce said asymmetric echo NMR signals, except that in each instance the second gradient is symmetric with respect to the first gradient and said symmetric echo NMR signals are detected at times following the associated 180° pulse duration by respective intervals approximately equal to the corresponding time intervals between said associated 90° and 180° pulse durations.

7. An improvement according to claim 6 wherein said symmetric echo NMR signals are resolved to produce a symmetric NMR image revealing the density of said nuclear species within said target regions, and said asymmetric echo NMR signals are resolved to produce an asymmetric NMR image revealing the density of said nuclear species in said target regions, substantially excluding those nuclei which have experienced internal magnetic field inhomogeneities.

8. An improvement according to claim 7 wherein the gradients applied during the detection of all of the asymmetric and symmetric echo NMR signals are of approximately equal magnitude.

9. An improvement according to claim 7 wherein said asymmetric image is subtracted from said symmetric image to produce an image revealing the density of nuclei of said species within said target regions experiencing internal magnetic field inhomogeneities.

10. An improvement according to claim 6 wherein said symmetric and asymmetric echo NMR signals are resolved to produce a subtraction image revealing the density of nuclei of said species within said target regions experiencing internal magnetic field inhomogeneities.

11. An improvement according to claim 6 wherein said symmetric and asymmetric echo NMR signals are resolved to produce an image corresponding to the subtraction of an asymmetric image from a symmetric image divided by said symmetric image, thereby to reveal the proportion of nuclei of said species within said target regions experiencing an internal magnetic field inhomogeneity.

12. An improvement according to claim 6 wherein said specimen is human tissue, and said symmetric and asymmetric echo NMR signals are resolved to produce an image revealing the presence of fat tissue within the target region of said specimen.

13. An improvement according to claim 6 wherein said specimen is a solid state material, and said symmetric and asymmetric echo NMR signals are resolved to produce an image revealing the density of non-aggregated water molecules within the target area of said specimen.

14. An improvement according to claim 6 wherein said specimen is a substance containing oil and water, and said symmetric and asymmetric echo NMR signals are resolved to produce an image revealing the density of oil within the target area of said specimen.

15. A method of NMR imaging comprising:
subjecting a target to a 90°-180° pulse sequence to produce a first NMR echo signal under symmetric gradient condition:
subjecting the same target to a 90°-180° pulse sequence to produce a second NMR echo signal under asymmetric gradient conditions; and
subtracting said second signal from said first signal, thereby to obtain subtraction signal data attributable substantially entirely to a selected nucear species experiencing internal magnetic field inhomogeneities inherent in said target.

16. A method according to claim 15 wherein said target is biological tissue, a solid state material containing water, or a substance containing both oil and water.

17. A method according to claim 15 wherein said target is a region within a specimen, a plurality of such targets within said specimen are subjected to said 90°-180° pulse sequences under both symmetric and asymmetric conditions, subtraction signal data are obtained from each said target, and an image of said specimen is resolved therefrom.

* * * * *